United States Patent [19]

Mooney et al.

[11] Patent Number: 5,246,916

[45] Date of Patent: Sep. 21, 1993

[54] METHOD OF FORMING SHAPED SUPERCONDUCTOR MATERIALS BY ELECTROPHORETIC DEPOSITION OF SUPERCONDUCTOR PARTICULATE COATED WITH FUSIBLE BINDER

[75] Inventors: John B. Mooney, San Jose; Arden Sher, San Carlos, both of Calif.

[73] Assignee: SRI International, Menlo Park, Calif.

[21] Appl. No.: 327,323

[22] Filed: Mar. 22, 1989

[51] Int. Cl.$^5$ ...................... H01L 39/12; C25D 13/02
[52] U.S. Cl. ..................................... 505/1; 204/181.5; 204/180.9; 505/739
[58] Field of Search .......................... 505/735, 1, 739; 204/180.9, 180.2, 180.9

[56] References Cited

U.S. PATENT DOCUMENTS

| | | | |
|---|---|---|---|
| 3,466,237 | 9/1969 | Barber | 204/181 |
| 4,719,026 | 1/1988 | Sher et al. | 204/180.6 |
| 4,810,339 | 3/1989 | Heavens | 204/180.1 |
| 4,859,652 | 8/1989 | Block | 505/1 |
| 4,879,270 | 11/1989 | Maxfield et al. | 204/37.1 |
| 4,939,119 | 7/1990 | Iwata et al. | 505/1 |
| 4,952,556 | 8/1990 | Mantese et al. | 505/1 |
| 4,952,557 | 8/1990 | Schmidt | 505/1 |
| 4,954,481 | 9/1990 | DeReggi et al. | 505/1 |
| 4,957,899 | 9/1990 | Heisman et al. | 505/1 |
| 4,975,412 | 12/1990 | Okazaki et al. | 501/1 |

FOREIGN PATENT DOCUMENTS 0289412 11/1988 European Pat. Off. .
1151492 5/1969 United Kingdom .

OTHER PUBLICATIONS

Poeppel R. B. "Fabrication of $YBa_2Cu_3O_7$ Superconducting Ceramics." in Nelson et al., *Chemistry of High Temperature Superconductors* (Wash., D.C. American Chemical Society, 1987), pp. 261–265.

Farrell, D. E., et al, "Superconducting Properties of Aligned Crystalline Grains of $Y_1Ba_2Cu_3O_7-\delta$", *Physical Review B*, vol. 36, No. 7, Sep. 1, 1987, pp. 4025–4027.

Ferreira, J. M., et al, "Magnetic Field Alignment of High-$T_c$ Superconductors $RBa_2Cu_3O_{7-\delta}$ (R=Rare Earth)", *Applied Physics A*, vol. 47, 1988, pp. 105–110.

Korobko, V. N., et al, "Production of Superconducting Coatings by Electrophoresis", Sverkhprovodimosti, Leningrad, 26-28 Sent., 1983, L. Issue, pp. 88–89.

Schaffert, R. M., *Electrophotography*, New York: John Wiley & Sons, 1965, pp. 69–73.

Sleight, A. W., "Chemistry of High-Temperature Superconductors", *Science*, vol. 242, Dec. 16, 1988, pp. 1519–1527.

Primary Examiner—John Niebling
Assistant Examiner—Kishor Mayekar
Attorney, Agent, or Firm—John P. Taylor

[57] ABSTRACT

A process is disclosed for forming shaped superconductors of the metal oxide type by electrophoretic deposition of superconducting particles which comprises providing particulate superconducting material of the metal oxide type coated with a fusible binder, electrophoretically depositing such coated superconducting particles on a substrate, heating the coated substrate sufficiently to fuse the binder to the substrate, fabricating the coated substrate into a desired shape, removing the binder, and then sintering the coated substrate to sinter the superconducting particles together. In a preferred embodiment the process further comprises immersing the coated substrate in an electrostatic field during the fusion step to both orient and maintain the superconducting particles in a desired direction.

18 Claims, 4 Drawing Sheets

PROVIDING A METAL OXIDE SUPERCONDUCTOR PARTICLE COATED WITH A FUSIBLE BINDER AND TREATED WITH A CHARGE AGENT

ELECTROPHORETICALLY DEPOSITING THE BINDER-COATED CHARGED SUPERCONDUCTOR PARTICLE ON A SURFACE OF A SUBSTRATE

HEATING THE COATED SURFACE SUFFICIENTLY TO FUSE THE BINDER-COATED SUPERCONDUCTOR PARTICLES TO THE SUBSTRATE WHILE OPTIONALLY IMERSING THE BINDER-COATED PARTICLES IN AN ELECTRIC FIELD

FORMING THE COATED SUBSTRATE INTO A SHAPED OBJECT

HEATING THE COATED SUBSTRATE TO REMOVE THE BINDER AND TO SINTER THE SUPERCONDUCTOR PARTICLES TO ONE ANOTHER AND TO THE SUBSTRATE

FIG. 1

METHOD OF FORMING SHAPED SUPERCONDUCTOR MATERIALS BY ELECTROPHORETIC DEPOSITION OF SUPERCONDUCTOR PARTICULATE COATED WITH FUSIBLE BINDER

BACKGROUND OF THE INVENTION

1. Field of the Invention

This invention relates to superconductor materials. More particularly, this invention relates to a method of forming shaped superconductor materials by electrophoretic deposition of previously formed superconductor particulate coated with a fusible binder followed by fusion of the binder, while optionally orienting the particulate in an electrostatic field, and subsequent removal of the binder and sintering of the superconductor particles.

2. Description of the Related Art

Since the discovery of superconductivity in 1911, the phenomena of a material being able to conduct electricity with almost no resistance when the material is cooled to a temperature approaching absolute zero (0° K.) has remained an interesting scientific curiosity having few applications which would justify the expense of maintaining the necessary liquid helium cooled system.

Recently, however, superconducting ceramic materials have been produced which exhibit this phenomena at much higher temperatures, e.g., 35° K., and, in some cases even higher than the boiling point of liquid nitrogen which boils at about 77° K. The ability to produce superconductivity in a material cooled by liquid nitrogen completely changes the economics which have previously restricted the applications to which superconductivity could be applied.

These new ceramic materials are sometimes referred to as triple-layer perovskite compounds because of the crystallography of the resulting structure; or 1-2-3 compounds because of the atomic ratios of at least some of these ceramic superconductors which may, for example, comprise 1 atom of a rare-earth (Lanthanum series) element such as lanthanum or yttrium, 2 atoms of an alkaline earth metal such as barium or strontium, and 3 atoms of copper. The superconducting ceramic also contains from 6.5+ to 7- atoms of oxygen which is usually referred to as $O_{(6.5+x)}$ where x is greater than 0 and less than 0.5, resulting in a chemical formula such as, for example, $YBa_2Cu_3O_{(6.5+x)}$.

While the superconducting properties of such ceramic materials have been confirmed by demonstration of the Meissner effect wherein the superconductor, when cooled to superconducting temperature, will exhibit magnetic properties sufficient to levitate a magnet above the superconductor, such ceramic superconducting materials are deficient in some of the essential physical properties needed to permit fabrication and practical usage of structures from such materials.

Most notable of these deficiencies is the extreme brittleness and poor mechanical strength of the superconducting ceramic structures which inhibits formation of shaped structures, e.g., coils or wires therefrom. Such superconducting ceramic materials also show evidence of extreme microcracking which is a further indication of brittleness and would also effect critical current density $J_c$.

In the fabrication of the previously known prior art superconductors, i.e., metal alloy superconductors which only exhibit superconducting characteristics at low absolute temperatures $\leq 25°$ K., Barber U.S. Pat. No. 3,466,237 describes the electrophoretic deposition of a powder layer of one of the metals which will form the superconducting alloy on a substrate comprising another metal in the superconducting alloy. The coated material is then heated sufficient to cause the two metals to react to form a layer of the superconducting alloy.

Great Britain Patent No. 1,151,492 describes a somewhat similar process for making conventional superconducting alloys, i.e., metal alloys exhibiting superconductivity at low absolute temperatures (T<25° C.), in which both metals which will ultimately form the superconducting alloy are electrophoretically deposited as powders on a substrate after which the coated substrate is heated to form the superconducting alloy.

Production of superconductors using electrophoresis is also apparently described by Korobko et al in Sverkhprovodimosti, Leningrad, 26-28 Sent., 1983, L. Issue, pp. 88-89, based on the English translation of the title as "Production of Superconducting Coatings by Electrophoresis".

The use of electrophoretic deposition techniques to form coatings which may, upon subsequent processing, exhibit superconducting properties is certainly of interest due to the close packing of materials which are deposited electrophoretically.

However, in the formation of the prior art metal alloy superconductors, subsequent processing of the metal alloy, such as to mold or fabricate it into a desired shape, would not involve the same problems as attempting to shape the recently discovered ceramic or metal oxide type superconductor materials because metal alloys are generally malleable, as opposed to the characteristic brittleness of the latter.

Thus, if the steps of electrophoretic deposition followed by heating to form the superconductor film, as taught in the prior art for forming superconducting metal alloys, were to be used in forming the high temperature superconducting ceramic or metal oxide films, the resulting film or coating would be too brittle to permit any subsequent shaping or fabricating.

Conversely, if the more recently discovered metal oxide or ceramic superconducting materials were to be formed first, then electrophoretically deposited in particulate form on a substrate, and then fabricated or shaped without heating the coated substrate to sinter the deposited particles together, portions of the deposited coating would become dislodged during such fabrication or shaping steps.

It would, therefore, be desirable to be able to electrophoretically deposit on a substrate or support previously formed particulate superconducting material of the ceramic or metal oxide type and to be able to then fabricate or form the coated substrate or support into a desired shape, prior to sintering of the particulate mass comprising the coating, without significant risk of loss of portions of the deposited coating during such fabrication.

SUMMARY OF THE INVENTION

It is, therefore, an object of this invention to provide a method of forming shaped superconductors of the metal oxide type by electrophoretic deposition of superconducting particles which have been treated to permit subsequent fabrication prior to a sintering step while minimizing risk of loss of superconductor coating material.

It is another object of this invention to provide a method of forming shaped superconductors of the metal oxide type by electrophoretic deposition of superconducting particles which have been coated with a binder to permit subsequent fabrication prior to a sintering step while minimizing risk of loss of superconductor coating material.

It is yet another object of this invention to provide a method of forming shaped superconductors of the metal oxide type by electrophoretic deposition of superconducting particles to permit subsequent fabrication prior to a sintering step while minimizing risk of loss of superconductor coating material which comprises providing particulate superconducting material of the metal oxide type coated with a fusible binder, electrophoretically depositing such coated superconducting particles on a substrate, heating the coated substrate sufficiently to fuse the binder to the substrate, and then sintering the coated substrate to remove the binder and sinter the superconducting particles together in the final desired shape.

It is still another object of this invention to provide a method of forming shaped superconductors of the metal oxide type by electrophoretic deposition of superconducting particles to permit subsequent fabrication prior to a sintering step while minimizing risk of loss of superconductor coating material which comprises providing particulate superconducting material of the metal oxide type coated with a fusible binder, electrophoretically depositing such coated superconducting particles on a substrate comprising an insulative material having a conductive pattern formed thereon, heating the coated substrate sufficiently to fuse the binder to the substrate, and then sintering the coated substrate to remove the binder and sinter the superconducting particles together.

It is a further object of this invention to provide a method of forming shaped superconductors of the metal oxide type by electrophoretic deposition of superconducting particles to permit subsequent fabrication prior to a sintering step while minimizing risk of loss of superconductor coating material which comprises providing particulate superconducting material of the metal oxide type coated with a fusible binder, electrophoretically depositing such coated superconducting particles on a substrate comprising an insulative material having a conductive layer formed thereon, heating the coated substrate sufficiently to fuse the binder to the substrate, patterning the coated substrate including the conductive layer beneath said coated particles, into a desired shape, and then sintering the coated substrate to remove the binder and sinter the superconducting particles together.

It is yet a further object of this invention to provide a method of forming shaped superconductors of the metal oxide type by electrophoretic deposition of superconducting particles to permit subsequent fabrication prior to a sintering step while minimizing risk of loss of superconductor coating material which comprises providing particulate superconducting material of the metal oxide type coated with a fusible binder, electrophoretically depositing such coated superconducting particles on a substrate, heating the coated substrate sufficiently to fuse the binder to the substrate, fabricating the coated substrate into a desired shape, and then sintering the coated substrate to remove the binder and sinter the superconducting particles together.

It is still a further object of this invention to provide a method of forming shaped superconductors of the metal oxide type by electrophoretic deposition of superconducting particles to permit subsequent fabrication prior to a sintering step while minimizing risk of loss of superconductor coating material which comprises providing particulate superconducting material of the metal oxide type coated with a fusible binder, electrophoretically depositing such coated superconducting particles on a substrate, heating the coated substrate sufficiently to fuse the binder to the substrate, fabricating the coated substrate into a desired shape, removing the binder, and then sintering the coated substrate to sinter the superconducting particles together.

It is yet another object of this invention to provide a method of forming shaped superconductors of the metal oxide type by electrophoretic deposition of superconducting particles to permit subsequent fabrication prior to a sintering step while minimizing risk of loss of superconductor coating material which comprises providing particulate superconducting material of the metal oxide type coated with a fusible binder, electrophoretically depositing such coated superconducting particles on a substrate, heating the coated substrate sufficiently to fuse the binder to the substrate while immersing said coated substrate in an electrostatic field to orient the superconducting particles in a desired direction, and then sintering the coated substrate to remove the binder and sinter the superconducting particles together.

It is still another object of this invention to provide a method of forming shaped superconductors of the metal oxide type by electrophoretic deposition of superconducting particles to permit subsequent fabrication prior to a sintering step while minimizing risk of loss of superconductor coating material which comprises providing particulate superconducting material of the metal oxide type coated with a fusible binder, electrophoretically depositing such coated superconducting particles on a substrate, heating the coated substrate sufficiently to fuse the binder to the substrate while immersing said coated substrate in an electrostatic field to orient the superconducting particles in a desired direction, fabricating the coated substrate into a desired shape, removing the binder, and then sintering the coated substrate to sinter the superconducting particles together.

These and other objects of the invention will be apparent from the following description and accompanying drawings.

BRIEF DESCRIPTION OF THE DRAWINGS

FIG. 1 is a flow sheet describing one embodiment of the process of the invention.

DETAILED DESCRIPTION OF THE INVENTION

Figure 2:
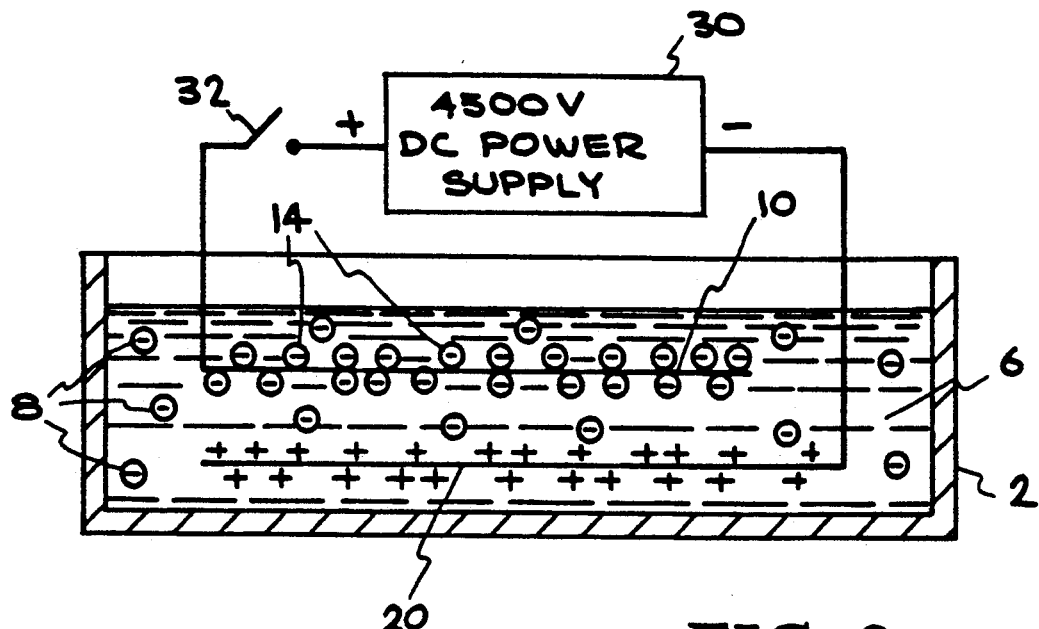
FIG. 2 is a side section view illustrating the electrophoretic deposition step of the process of the invention.

The invention comprises a method for forming shaped superconductor materials by electrophoretic deposition of previously formed superconductor particulate coated with a fusible binder followed by fusion of the binder and subsequent removal of the binder and sintering of the superconductor particles.

The particular type of superconductor material toward which the invention is particularly directed is the new metal oxide or ceramic type superconductor material sometimes referred to as a multi-layer perovskite compound because of the crystallography of the resulting structure.

One such group of compounds is referred to as 1-2-3 compounds because of the atomic ratios of 1 atom of an element such as a rare-earth (lanthanum series) element, e.g., lanthanum or yttrium; 2 atoms of another element such as an alkaline earth metal, e.g., barium or strontium; and 3 atoms of a metal such as copper. The superconducting ceramic also contains from 6.5+ to 7- atoms of oxygen which is usually referred to as $O_{(6.5+x)}$ where x is greater than 0 and less than 0.5, resulting in a chemical formula such as, for example, $XM_2Cu_3O_{(6.5+x)}$, where X represent the first element, e.g., a rare earth; and M represents the second element, e.g., an alka-line earth metal.

Other metal oxide or ceramic superconducting compounds which exhibit such superconductivity and which may be employed in the practice of the method of the invention include compounds in which X in the formula above is thallium and M in the formula above is one or more alkaline earth metals such as $Tl_2Ba_2Ca_2Cu_3O_x$ or compounds where X is bismuth such as $Bi_2CaSr_2Cu_3O_y$. In general the method should be applicable to any known or future superconducting material with the only requirement being that the superconductor particles can be sintered after deposition.

Thus, the terms "metal oxide superconductor" or "ceramic superconductor", as used herein, are intended to include an oxide of three or more elements which may include rare earth elements, alkaline earth metals, and other metals such as bismuth, copper, lead, and thallium. However, the invention may be considered to be applicable to any nonmalleable superconductor materials, even if that material is not deemed to be either an oxide or a ceramic material.

When one or more rare earth elements are used in the metal oxide or ceramic superconductor, they may comprise one or more rare earth elements selected from the class consisting of scandium, yttrium, and any of the lanthanide series of rare earths, including lanthanum, neodymium, promethium, samarium, europium, gadolinium, terbium, dysprosium, holmium, erbium, thulium, ytterbium, and lutetium with the possible exceptions of cerium and praseodymium which have not, to date, been successfully used in forming superconducting materials.

Usually the metal oxide superconductor will also include one or more alkaline earth elements selected from the class consisting of Ba, Ca, and Sr.

The metal oxide or ceramic superconductor useful in the invention may also contain one or more metals, including metals selected from the class consisting of bismuth, copper, lead and thallium.

In accordance with the invention, the metal oxide or ceramic superconductor is first formed, as is now well known in the art, by mixing together the proper stoichiometric ratio of the desired constituents, including a source of oxygen, and heating the mixture, for example, to a temperature of from about 850° to about 950° C. in an oxidizing atmosphere at atmospheric pressure for a period of from about 1 to about 24 hours to form a solid superconductor. The resulting superconductive material is then ground into particles having a particle size range of from about 1000 Angstroms (0.1 microns) to about 10 microns, preferably from about 1 to about 5 microns. If desired, multiple firing and grinding cycles may be employed to improve the mixing of the oxides. Cooling the mixture after firing at a rate of about 2° C. per minute in $O_2$ is also beneficial.

In accordance with the invention, the particulated metal oxide superconductor is then coated with a fusible binder material having a melting point and vaporization or decomposition temperature below the sintering temperature of the superconductive material encapsulated within the binder. The fusible binder material, in accordance with the invention, must also be capable of accepting a charge by reaction or interaction with a charge agent capable of imparting a charge on the binder coated superconductor particle.

Usually, the fusible binder material will comprise an organic material. However, the use of nonorganic binder materials should be deemed to be within the scope of the invention provided that they meet the above criteria. An example of such a low melting inorganic material might, for example, may comprise a silicone material.

Fusible binders useful in the practice of the invention having melting and decomposition or vaporization temperatures below the sintering temperature of the metal oxide superconductor material and which are capable of interacting with a charge agent to form a charged particle include, for example, polystyrene, styrene copolymers, styrenated HC, polyvinyl acetate, polyethylene glycol, phenolic resins, acrylic polymers such as polymethyl methacrylate, vinyl chloride resins, and polyester resins, and m-leic rosin.

Examples of other binders suitable for use in the practice of the invention include carnauba wax and commercial polymers such as an ethylene-acrylic acid copolymer know as A-C 540 available from Allied Chemical Corporation and mixtures of such polymers. Other binders and their sources may be found on page 73 of R. M. Shaffert's book "ELECTRO-PHOTOGRAPHY", published by John Wiley and Sons in 1965 and in Sher et al U.S. Pat. No. 4,719,026, cross-reference to which is hereby made.

The metal oxide superconductor particles may be coated with the fusible binder by dry milling in a rubber mill at a temperature above the melting point of the binder. In this manner the surfaces of the individual particles are coated with the binder. This coating of particles with binder is also discussed in more detail in the aforementioned Sher et al U.S. Pat. No. 4,719,026.

The binder-coated metal oxide superconductor particles are then charged by treating them with a charge agent or charge director capable of imparting a charge in the particles which will permit the particles to be electrophoretically deposited on a substrate. While this step of treating the binder-coated particles with the charge agent is described as a separate step, it is possible to treat the particles with the charge agent during the step of coating the particles with the binder, although this is not preferred.

The charge agent may comprise any material capable of imparting a charge on the coated particle and may comprise a liquid such as a hydrocarbon or a solution containing a metal soap or a surfactant. Examples of surfactants which may be used as the charge agents are listed in Table I below.

TABLE I

| Name | Type | Source |
|---|---|---|
| Rexobase PW | Naphthenic Deriv. | Emkay |
| Peregal OK | Polyethanol Quat | Antara |
| Priminox 32 | Alkyl PEG Amine | Rohm & Haas |
| Rexobase XX | Amide Condensate | Emkay |
| Priminox 10 | Alkyl PEG Amine | Rohm & Haas |
| Victawet 58B | Pentacaprylphosphate | Victor |
| Alkaterge T | Oxazoline | Com. Solvents |
| Ethomeen T/25 | Tertiary Amine | Armour |
| Nopcogen | Stearic Polyamine | Nopco |
| Alkanol B | Naphthalene Sulfonate | DuPont |
| Aerosol OT | Alkyl Sulfonate | Amer. Cyanamid |
| Nagamine 142A | Amine Ester | Synthetic |

Examples of metal soaps which may be used as charge agents include cobalt naphthenate, manganese naphthenate, calcium stearate, zinc stearate, cobalt soyate, lead stearate, and cobalt acetylacetonate.

Examples of other materials which can be used as charge agents include Lecithin, barium petronate, barium sulfosuccinate, and salts of bistridecyl sulfosuccinae. Barium sulfosuccinate is the preferred charge agent or director.

The charge agent may be reacted or interacted with the coated metal oxide superconductor particle by merely contacting the coated particle with the liquid containing the charge agent. Advantageously the coated particle and the charge agent are brought into intimate contact with one another by agitating the mixture, such as by vigorous stirring or by ball milling. While the use of a liquid is preferred in the charging step, it should be noted that the binder-coated superconductor particles and the charge director or agent may be dry mixed together, for example, by ball milling with glass beads.

In a preferred embodiment, the charge agent or director is brought into intimate contact with the binder-coated superconductor particles by wet-milling the particles using a nonpolar dispersant liquid such as the low boiling isomerized aliphatic hydrocarbons described in the aforementioned Sher et al U.S. Pat. No. 4,719,026 and available from the Exxon Corporation under the trademark ISOPAR. Usually this contact period will be for a period of from about 10 minutes to about 5 hours to assure imparting of charge to substantially all of the coated particles, i.e., 90% or more of the particles.

It should be noted that the absence of charge on some of the particles will not interfere with the subsequent electrophoretic deposition of the charged particles on a substrate. However, since the uncharged particles will not participate in the electrophoretic deposition, process efficiency will dictate that there be a substantial amount of charged particles in the deposition liquid.

It should also be noted that while the choice of binder material is, in part, dictated by the subsequent processing of the superconductor particle, the step of applying the binder to the metal oxide superconductor particle as a coating and the step of imparting of charge to the coated particle by a charge agent comprise well known steps in the field of xerography wherein a pigment, e.g., carbon black, forms the nucleus of the binder-coated particle instead of the metal oxide superconductor. Thus, the described process for applying the binder coating to the semiconductor particle and imparting a charge to the coated particle is by way of example only and any other techniques used in the xerographic arts to apply the binder coating and to impart a charge to the coated particle may also be employed in the instant process.

After forming the binder-coated charged superconducting particles, the coated particles are electrophoretically deposited onto a substrate surface. Preferably this step is carried out by first dispersing the charged and coated particles in a dielectric liquid suitable as the electrophoresis bath. Examples of liquids which may be used as the electrophoresis bath include petroleum hydrocarbons and perfluoralkanes. It is important that the liquid used in the electrophoresis bath have a low dielectric constant and high resistivity. It should be noted here that while the use of a liquid electrophoresis bath is preferred, the suspension of particles in a fluid which characterizes an electrophoresis bath may comprise a dry process such as, for example, a fluidized bed of such charged particles, as will be described below.

The concentration of the coated particles in the dispersion medium may range from as little as 1 grams per liter (g/l) to as much as 50 g/l. Preferably the solids concentration will range from about 15 g/l to about 25 g/l, with a typical solids concentration being about 20 g/l.

The substrate or surface may then be placed in the electrophoresis bath and connected to one electrode of a high voltage DC power source while a counter electrode, which is also connected to the power source, is also placed in the bath. There are at least three different ways in which the binder-coated superconductor particles may be deposited in the electrophoresis bath.

First of all, the substrate on which the particles are to be deposited may be a metal electrode such as a silver electrode or a silver coated metal electrode such as copper capable of withstanding the subsequent sintering temperature of from about 850°–920° C. Thus, the substrate to be electropho-etically coated may comprise a metallic substrate such as copper, titanium, tantalum, niobium, silver, gold, or one of the six platinum metals.

Secondly, if the surface or substrate to be coated is not a conductor, a conductive layer or pattern may be first formed on the substrate or surface comprising, for example, a layer of copper or a precious metal such as silver or gold. Silver is preferred as it has been found to be more compatible with some superconductors such as yttrium-based superconductors than copper or gold. Such conductive layers or patterns may be formed on the surface of a nonconductive member by well known techniques such as electroless plating which form no part of the present invention. Whether the conductive metal deposited on the nonconductive member comprise a continuous layer or a patterned layer, will depend on whether or not deposition of a patterned layer of coated superconducting particles is desired. In this case, the high voltage DC power source is connected directly to the conductive metal layer or pattern, as well as to the counter electrode in the bath for a prescribed time determined by the layer thickness desired.

The substrate on which the binder-coated superconducting particles will be electrophoretically deposited may also comprise a nonconductive material such as any nonconductive ceramic material such as, for example, $Al_2O_3$, $MgO$, $ZrO_2$, $TiO_2$, or $SiO_2$ which has been applied over a conductive substrate or layer. The high voltage DC power source would then be connected to the conductive substrate as well as to the counter electrode in the bath for a prescribed time determined by the layer thickness desired.

In any case, the conductive electrode, conductive layer or pattern, or conductive substrate will be connected to either the positive or negative electrode of the DC power supply depending upon whether the coated superconducting particles have a positive or negative charge. If the particles have a negative charge, the conductive portion of the substrate to be coated will be connected, for example, to the positive electrode of the power supply, i.e., made the anode in the bath, and vice versa, for positively charged particles.

The voltage used in the electrophoretic deposition will range from about 2000 to about 5000 volts, typically about 4500 volts, for a deposition period of from about 0.1 to about 2 seconds or more. As discussed in the aforesaid Sher et al U.S. Pat. No. 4,719,026, the thickness of the coating is not only a function of the concentration of solids in the bath, but also varies as a function of the voltage and of time.

The surface on which the binder-coated charged particles are to be deposited should preferably be maintained close to the counter electrode to establish the desired high electric field between the electrodes to achieve the desired high packing density of the deposited material. The spacing between the electrodes should, therefore, range from about 0.5 to about 5 millimeters, preferably about 1 to about 2 millimeters. Larger spacing with consequently lower fields may be used for deposition, but the desired high packing density of the deposited binder-coated superconducting particles will not be as easily achieved.

After the deposition step, the coated substrate may be removed from the bath, rinsed, and then dried to remove any remaining bath liquid. The coated substrate may then be heated to a temperature of from about 60° to about 120° C. to fuse the binder to the substrate and to adjoining particles. Higher fusion temperatures may be used as long as the temperature does not approach or exceed the volatilization or decomposition temperature of the binder.

In another embodiment, the charged binder-coated superconducting particles may be applied to a charged surface by a dry process similar to that used in dry office copying. For example, a thin dielectric surface (1-10 microns) with a conductive back can be charged, such as with a corona, if it is desired to produce a uniform layer, or by contact with an electrode to form a charge pattern.

However, this method is not preferred since the fields are relatively small and decrease as the charge falls due to neutralization of the charge by the deposited toner, resulting in a less dense deposit. In general, however, the toner may be applied dry using any of the electrophotographic and dielectric printing processes known in the art such as those discussed in the aforementioned Schaffert book using substrates that are chemically compatible with the superconductor and capable of tolerating the sintering temperature and oxygen atmosphere.

In one embodiment, as will be described in more detail below with respect to the drawings, the coated superconducting particles may be oriented during the fusing step by immersing the coated substrate in an electrostatic field.

Figure 7:
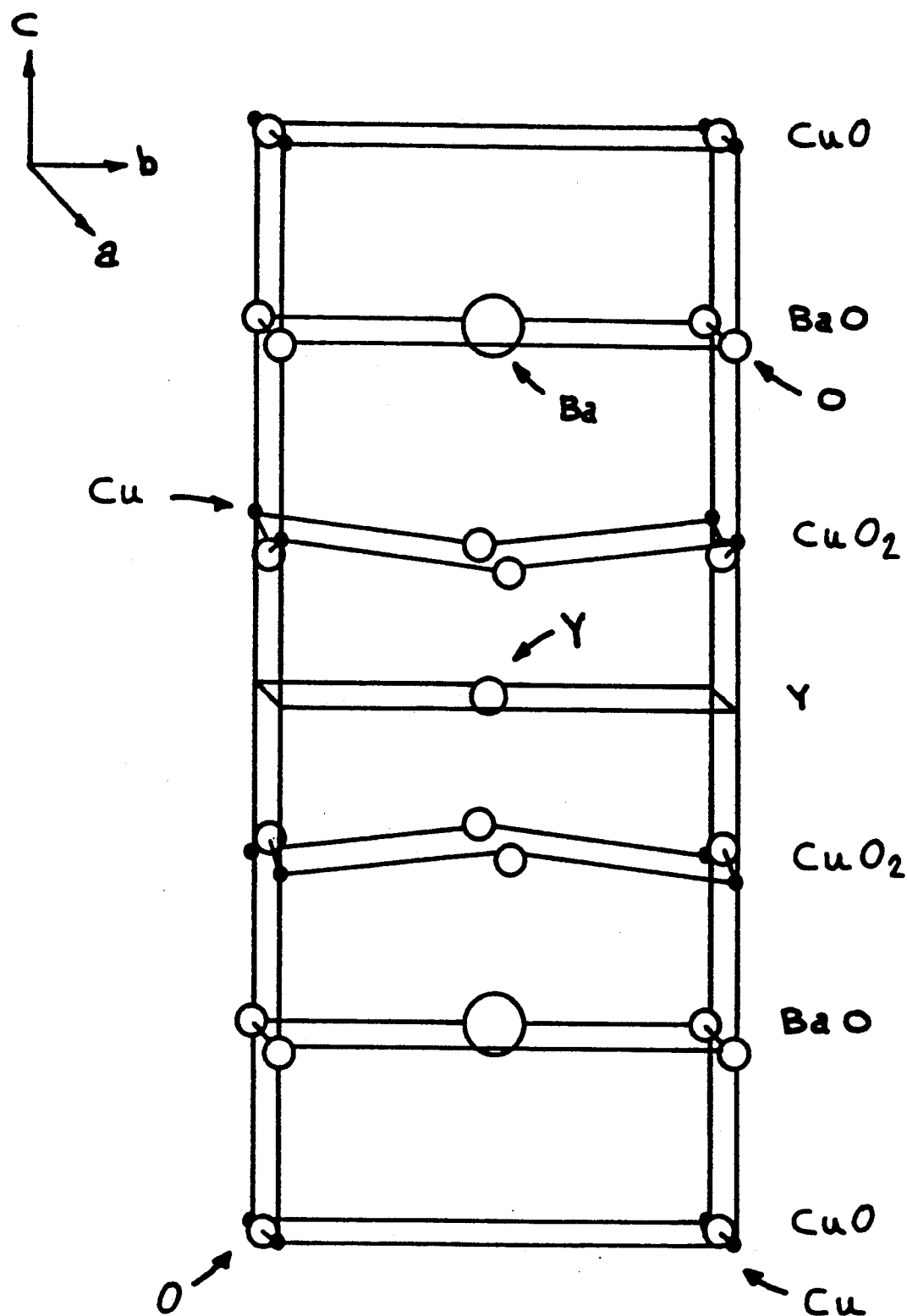
FIG. 7 is a crystal structure of a typical ceramic oxide superconductor showing the copper atoms lying in the a-b planes defined by the a axis and b axis of the structure.

The high $T_c$ superconducting materials have an anisotropic polarizability, even at room temperature. The polarizability along the a-b planes in the structure in which the copper atoms lie, as shown in FIG. 7, is large compared to that perpendicular thereto (along the c axis). Particles made of this materials and exposed to a uniformly applied electric field will experience a torque that causes them to orient with their princial planes (the a-b planes) parallel to the applied field. The superconducting properties of the materials are also anisotropic, and the critical current along the a-b planes is higher than that perpendicular to these planes (along the c axis). Thus, if one can orient the particles so the current flows in the high critical current direction along the a-b planes of the particles, the oriented powdered material will more closely the behaviour of single crystal material and be superior to a randomly oriented powder.

It is important that the coated substrate only be heated sufficiently at this stage to soften the binder enough to provide adherence of the coated particles to one another and to the substrate without interfering with subsequent shaping or forming steps to fabricate the superconducting particle-coated substrate into a desired end product.

For example, when the substrate to be coated comprises a wire, fusing, of the coated particles to one another and to the substrate should not interfere with subsequent shaping of the wire into a desired shape such as a coil. The coated substrate may be fabricated into any other shape or form as desired and the superconductor particles will be held in place on the substrate during such fabrication steps, in accordance with the invention due to the fused binder.

After the fusing and shaping steps, the binder may be removed by volatilization or burning in oxygen or air and the coated substrate sintered to provide permanent and electrically conductive adherence of the particles to one another and, where appropriate, to the underlying substrate.

The binder removal and sintering steps may be carried out separately or may be carried out in a single step by heating the coated and shaped substrate up to a temperature at which the binder will volatilize or decompose followed by further elevation of the temperature up to a sintering temperature range. The binder removal temperature will usually range from about 450° C. to about 600° C., depending upon the chemical composition of the binder with a range of from about 500° C. to about 550° C. being typical. The time for the binder removal may be determined empirically as that period needed to remove substantially all of the binder, i.e., about 99.9 wt.%. Advantageously, to achieve such complete removal of the binder, the binder removal step will be carried out as close to the binder volatilization or decomposition temperature as possible.

The sintering temperature for the superconducting particles will range from about 800° C. to about 1000° C., preferably from about 850° C. to about 920° C., typically about 900° C. It is important that at least this step of the process be carried out in an oxygen-containing atmosphere to prevent loss of oxygen from the metal oxide superconductor material. The sintering time will vary from a minimum of from about 10 minutes up to as much as about an hour, with typical sintering times ranging from about 15 to about 45 minutes. The resulting sintered metal oxide superconducting coating will range from a thickness of about 8 micrometers to about 12 micrometers, typically about 10 micrometers.

All of the heating steps, i.e., the fusing, binder removal, and sintering steps may be carried out at atmospheric pressure. However, since at least the sintering step must be carried out in a controlled atmosphere of oxygen, it may be preferable to carry out the sintering step at a positive pressure to accelerate the sintering step.

Turning now to FIG. 2, the electrophoresis step of the invention is shown in its simplest form wherein a bath container 2 is shown containing a first electrode 10 and a second electrode 20. Electrode 10 is connected to the positive terminal of 4500 volt DC power supply 30 through switch 32, while electrode 20 is connected to the negative terminal of power supply 30. Bath container 2 is filled with a liquid 6 in which is dispersed negatively charged particles 8 comprising a 1-2-3 metal oxide superconductor material coated with a fusible binder.

When switch 32 is closed, the negatively charged coated superconductor particles 8 are electrophoretically deposited on the surface of positive electrode 10, forming a layer 14 on the surface thereof, while the positive counter ions migrate to the surface of negatively charged electrode 20.

Figure 3:
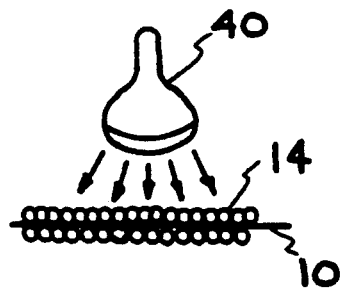
FIG. 3 is a side section view showing the fusing step of the process of the invention.

The power is then shut off by opening switch 32 and the coated electrode 10 is removed from bath 2. It may be allowed to air dry prior to the fusion step or, alternatively it may be dried during the fusing step, provided the "mud cracking" described in the aforesaid Sher et al U.S. Pat. No. 4,719,026 does not occur. In the illustrated embodiment, coated electrode 10 is exposed to a source of heat by directly placing it under a heat lamp 40, as shown in FIG. 3, and heating the coated substrate to a temperature of from about 60°–120° C. to fuse the binder on each particle to adjoining particles comprising layer 14 as well as to the surface of electrode 10.

Figure 4:
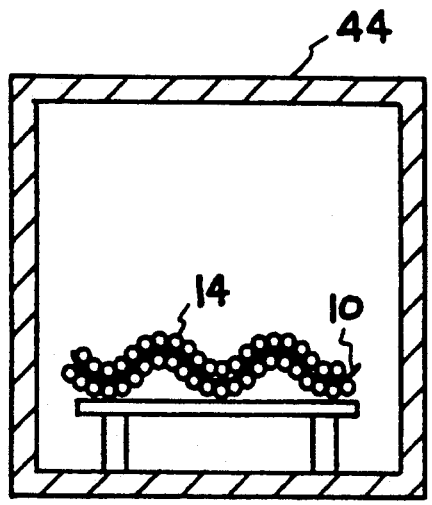
FIG. 4 is a side section view showing the sintering step of the process of the invention.

As shown in FIG. 4, coated electrode 10 may then be bent into a desired shape and then placed into a furnace 44 and heated sufficiently to volatilize or decompose the binder. Furnace 44 may then be further heated to a temperature of about 900° C. under an oxygen atmosphere to sinter the superconducting particles to one another and to the surface of electrode 10.

Figure 5:
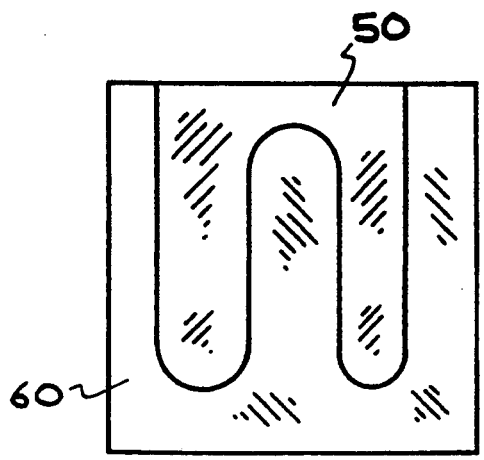
FIG. 5 is a top view of another embodiment of the proces of the invention showing formation of a patterned layer on a substrate.

Turning to FIG. 5, an alternate embodiment is shown wherein a patterned layer 50 of sintered superconducting material has been formed on a ceramic substrate 60 such as $ZrO_2$. Patterned layer 50 may comprise the same binder coated metal oxide superconducting material as used in the previous embodiment.

Layer 50 is formed by electrophoretic deposition on the ceramic substrate either by initially forming a patterned layer of metal on ceramic substrate 60 or by coating the entire surface of ceramic substrate 60 with a metal layer and then, after electrophoretic deposition of the superconductor layer, forming the desired pattern by, for example, conventional positive or negative photolithographic techniques followed by dry or wet etching to form the desired pattern.

When the patterning of the coated substrate to form patterned layer 50 is done after the deposition step, it preferably may be done following the fusing step, for example, using a binder material which can function as an electron beam resist wherein the unirradiated areas may be removed to leave the desired pattern on the substrate. Alternatively, the patterning may be done after the sintering step using, for example laser ablation for patterning of the layer.

Substrate 60 having patterned superconductor layer 50 thereon can be used, in connection with other similarly patterned substrates, to form an x-band microwave cavity, for example. Such a cavity should have a much higher Q than has previously been attained with conventional materials. The Q of such a cavity should be limited not by wall losses but by coupling losses through the input aperture (and any output aperture used). Such high-Q cavities should provide exceptional quality frequency reference standards and should be useful to improve mode-locking and other applications.

Figure 6:
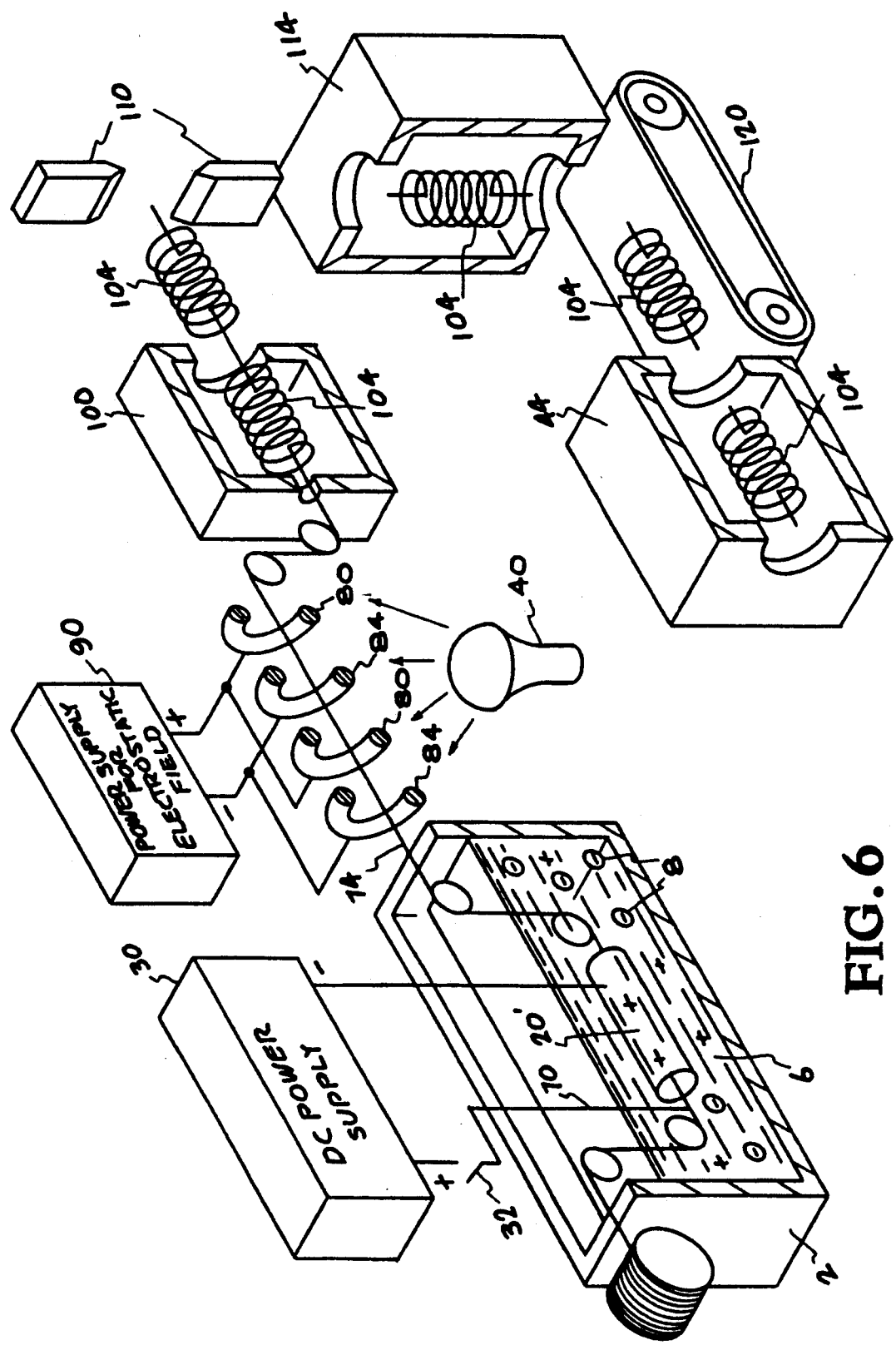
FIG. 6 is a side section view of another embodiment of the process of the invention showing pictorially an automated process which includes electrostatic orientation means which orient the position of the superconducting particles on the substrate during the fusing step. of a patterned layer on a substrate.

FIG. 6 illustrates yet another embodiment wherein in place of electrode 10, a metal wire 70, such as a silver wire, is connected to the positive terminal of a power supply and is coated on a continuous basis with a electrophoretically deposited layer 74 of metal oxide type superconducting material similar to that employed in the previous embodiments by passing wire 70 through a tubular electrode 20' which is immersed in the electrophoresis bath and connected to the negative terminal of the power supply.

Coated metal wire then passes through a heating station wherein heat lamp 40 heats the binder-coated superconducting particles sufficiently to fuse the binder on the particles. In this embodiment, circular or ring electrodes 80 and 84, which are spaced about 1 millimeter apart, and are respectively maintained at +600 and −600 volts by electrostatic field power supply 90, establish an electrostatic field therebetween parallel to the axis of wire 70 which orients the superconductor particles while the binder is fusing to thereby lock the particles into this orientation.

The coated wire 70 now passes through a coiling station 100 wherein wire 70 is formed into a circular coil 104 which is severed from the remainder of wire 70 at cutting station 110. Coil 104 is then exposed to sufficient heat from heat source 114 which may comprise an of coil to remove the binder from coating layer 74 on wire 70 and coil 104 passes into sintering furnace 44 via conveyer belt 120 wherein the oriented superconductor particles on coated coil 104 are sintered together and to wire 70 while being maintained in an oxygen atmosphere.

In this embodiment, not only is the process of the invention illustrated as being carried out in a continuous manner, but the process includes the step of immersing the coated wire in an electrostatic field during the fusing step to thereby provide a preferred alignment of the superconductor particles by the establishment of the electrostatic field, as opposed to a random alignment.

It should be noted that while this immersion of the superconducting coating in an electrostatic field has been illustrated with respect to this last embodiment wherein a metal wire forms the substrate, the use of an electrostatic alignment field in which the coated substrate is immersed during the binder fusing step to thereby align the superconducting particles in a particular direction, rather than a random orientation, may be applicable to any of the embodiments of the process.

As shown in FIG. 6, the electrostatic field is established parallel to the preferred direction of orientation of the superconducting particles on the substrate. Thus, in the case of a wire, as shown in FIG. 6, the electrostatic electrodes are oriented to establish an electrostatic field having an axis along the axis of the wire to provide alignment of the superconducting crystals with a preferred axis of superconducting current flow parallel to the axis of the wire.

The strength of the electrostatic field may range from at least $5 \times 10^3$ volts/cm to $1.2 \times 10^4$ volts/cm by providing DC voltages on the electrostatic electrodes ranging from at least 500 volts up to 1200 volts across a spacing of 0.1 cm. Higher strength fields, while operational, are not needed provided the electrostatic electrodes are located proximate the particles to be oriented, i.e., within less than about 1 millimeter of the coated surface of the substrate. A typical electrostatic field which is satisfactory for providing the desired orientation of the coated superconducting particles during the fusion step comprises electrodes located within 1 millimeter of the coated substrate and maintained at a DC voltage of at least 500 volts.

To further illustrate the invention, a previously formed metal oxide superconductor material having the formula $YBa_2Cu_3O_{(6.5+x)}$, where x is greater than 0 and less than 0.5, was ground into particles having an average size of about 1 micron. A fusible binder was formed on the surface of these particles by milling 3.1 grams of the superconductor particles with 0.2 grams of a methylethacrylate/n-butylmethacrylate copolymer binder.

The binder-coated particles were then dispersed in an electrophoresis bath containing a hydrocarbon liquid known as "ISOPAR-H" at a concentration of 1-2 wt.% solids. 10 milliters of a 4 wt.% solution of a barium sulfosuccinate in ISOPAR-H charge director was then added to the bath to place a negative charge on the coated particles, and two metal electrode plates, one of which had a silver surface, were immersed in the bath. The silver-surfaced electrode was connected to the positive pole and the other electrode to the negative pole of a 4500 volts DC power supply for a period of about 0.1 seconds to form about a 10 micron thick coating on the positive electrode.

The coated electrode was then removed from the bath and heated to approximately 130° C. to fuse the binder. During this melting process the application of a large uniform electrostatic field should cause the particles to orient by rotating as particles to minimize their energy in the external field.

The coated electrode with the fused binder coating on the particles can be formed into a shaped object without loss of the superconductor particles thereon by virtue of the fused binder after which the binder can be removed and the coated object sintered to sinter the particles to one another and the electrode substrate.

Thus, the invention provides a process for forming a layer of a fusible binder-coated metal oxide type superconductor on a substrate by electrophoretic deposition to provide a dense layer followed by fusion of the binder, with or without immersion in an electrostatic field to provide orientation of the particles, to provide adherence of the particles to the substrate during a subsequent fabrication step to form a desired final shape wherein the binder may then be removed, after such fabrication, and the coated substrate sintered to form a shaped metal oxide type superconductor.

Having thus described the invention, what is claimed is:

1. A process for forming a shaped metal oxide superconductor article from metal oxide superconductor particles, which comprises:
   (a) providing metal oxide superconductor particles coated with a fusible binder layer having a melting point below the sintering temperature of said superconductor particles and treated with a charge agent to provide a charge on said coated superconductor particles;
   (b) electrophoretically depositing said charged coated superconductor particles on a conductive surface;
   (c) heating said coated surface to within a temperature range of from about 60° C. to about 120° C. to fuse said binder to said surface;
   (d) shaping said coated surface into a shaped article after said fusing step; and
   (e) thereafter sintering said coating surface to remove said binder and to bond said superconductor particles to one another and to said surface to form said metal oxide superconductor article.

2. The process of claim 1 including the step of removing said fusible binder after said shaping step and prior to said sintering step.

3. The process of claim 1 including immersing said coated substrate in an electrostatic field during said fusion step to orient the direction of the particles during the fusion step whereby fusion of said binder will maintain said superconducting particles in said direction.

4. A process for forming a metal oxide superconductor, comprising an oxide of three or more elements selected from the class consisting of rare earth elements, alkaline earth elements, bismuth, copper, lead, and thallium, which comprises:
   (a) providing particles of said metal oxide superconductor coated with a fusible binder layer having a melting point below the sintering temperature of said superconductor particles and treated with a charge agent to provide a charge on said coated superconductor particles;
   (b) providing a conductive surface by forming a conductive layer on an insulative surface;
   (c) electrophoretically depositing said charged coated superconductor particles onto said conductive surface, on said insulative substrate to form a layer of said particles thereon;
   (d) heating said substrate and said layer of particles thereon to fuse said binder to said substrate surface; and
   (e) sintering said substrate and said layer of particles fused thereto to remove said binder and to bond said superconductor particles to one another and to said surface of said substrate.

5. The process of claim 4 including the step of forming a conductive pattern by patterning said conductive surface on said substrate prior to said electrophoretic deposition step and then depositing said binder-coated superconducting particles on said conductive pattern on said substrate during said electrophoretic deposition step.

6. The process of claim 4 wherein said insulative substrate comprises a nonconductive ceramic material.

7. The process of claim 6 including the step of patterning said layer of superconductor particles and said underlying conductive layer after said fusing step to form a pattern of superconducting material on said insulative substrate.

8. The process of claim 7 wherein said patterning step is performed prior to said sintering step.

9. The process of claim 7 wherein said patterning step is performed after said sintering step.

10. A process for forming a shaped metal oxide superconductor which comprises:
   a) providing a metal oxide superconductor material in particulate form;
   (b) coating said metal oxide superconductor particles with a fusible binder layer having a melting point below the sintering temperature of said superconductor particles;
   (c) treating said coated superconductor particles with a charge agent to provide a charge on said coated superconductor particles;
   (d) electrophoretically depositing a layer of said charged coated superconductor particles on a substrate surface;
   (e) immersing said coated substrate in an electrostatic field to orient the direction of said particles;
   (f) heating said coated substrate surface to fuse said binder to said surface, while maintaining said coated substrate immersed in said electrostatic field during said fusion step to thereby maintain said particle orientation during said fusion step and to thereafter maintain said superconducting particles oriented in said direction;
   (g) shaping said coated substrate into a shaped object after said fusing step; and
   (h) sintering said coated substrate to remove said binder and to bond said superconductor particles to one another and to said surface.

11. The process of claim 10 including immersing said coated substrate in an electrostatic field during said fusion step to orient the direction of the particles during said fusion step and to thereafter maintain said superconducting particles in said direction.

12. The process of claim 10 wherein said shaping step further includes forming said coated substrate into a coil.

13. The process of claim 10 wherein said step of electrophoretically depositing said binder-coated metal oxide superconductor particles onto said surface further includes depositing said particles onto the surface of a metal wire.

14. The process of claim 10 wherein said step of electrophoretically depositing said binder-coated metal oxide superconductor particles onto said surface further includes depositing said particles onto the surface of a metal wire and said shaping step further comprises shaping said coated wire into a wire coil.

15. A process for forming a patterned metal oxide superconductor which comprises:
   (a) providing a metal oxide superconductor material in particulate form; oxide superconductor
   (b) coating said metal oxide superconductor particles with a fusible binder layer having a melting point below the sintering temperature of said superconductor particles;
   (c) treating said coated superconductor particles with a charge agent to provide a charge on said coated superconductor particles;
   (d) electrophoretically depositing said charged coated superconductor particles on a conductive surface formed on a insulative substrate to form a layer of superconductor particles on said insulative substrate;
   (e) heating said coated surface to fuse said binder to said surface;
   (f) patterning said layer of superconductor particles and underlying conductive layer to form a conductive pattern on said substrate; and
   (g) sintering said coated substrate to remove said binder and to bond said superconductor particles to one another and to said substrate.

16. A process for forming an end product comprising a metal oxide superconductor having the formula $XM_2Cu_3O_{(6.5+x)}$ wherein X is selected from the class consisting of thallium, bismuth, and a rare earth, M is one or more alkaline earth metals, and x is greater than 0 and less than 0.5, which comprises:
   (a) providing particles of said metal oxide superconductor coated with a fusible binder layer having a melting point below the sintering temperature of said superconductor particles and treated with a charge agent to provide a charge on said coated superconductor particles;
   (b) providing a conductive surface by forming a conductive layer on an insulative substrate;
   (c) electrophoretically depositing said charged coated superconductor particles on said conductive surface of said substrate;
   (d) heating said coated substrate to fuse said binder to said surface;
   (e) fabricating said coated substrate into said end product after said fusing step; and
   (f) thereafter sintering said coated substrate to remove said binder and to bond said superconductor particles to one another and to said substrate.

17. A process for forming a metal oxide superconductor article from metal oxide superconductor particles, which comprises:
   (a) providing metal oxide superconductor particles coated with a fusible binder layer having a melting point below the sintering temperature of said superconductor particles and treated with a charge agent to provide a charge on said coated superconductor particles;
   (b) electrophoretically depositing said charged coated superconductor particles on a conductive surface;
   (c) heating said coated surface to fuse said binder to said surface;
   (d) shaping said coated surface after said fusing step; and
   (e) thereafter sintering said coated surface in the presence of oxygen and within a temperature range of from about 800° C. to about 1000° C. to remove said binder and to bond said superconductor particles to one another and to said surface to form said metal oxide superconductor article.

18. A process for forming a metal oxide superconductor product from metal oxide superconductor particles, which comprises:
   (a) providing metal oxide superconductor particles coated with a fusible binder layer having a melting point below the sintering temperature of said superconductor particles and treated with a charge agent to provide a charge on said coated superconductor particles;
   (b) electrophoretically depositing said charged coated superconductor particles on a conductive surface of a substrate;

(c) heating said coated substrate to within a temperature range of from about 60° C. to about 120° C. to fuse said binder to said substrate;
(d) fabricating said coated substrate into a product after said fusing step; and
(e) thereafter sintering said coated substrate in the presence of oxygen and within a temperature range of from about 800° C. to about 1000° C. to remove said binder and to bond said superconductor particles to one another and to said substrate to form said metal oxide superconductor product.

* * * * *